United States Patent
Beall (10) Patent No.: US 9,763,353 B1
(45) Date of Patent: Sep. 12, 2017

(54) MASS STORAGE DEVICE RETAINER ASSEMBLY

(71) Applicant: Amazon Technologies, Inc., Seattle, WA (US)

(72) Inventor: Christopher Strickland Beall, Woodinville, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 14/666,201

(22) Filed: Mar. 23, 2015

(51) Int. Cl.
*H05K 5/00* (2006.01)
*H05K 7/14* (2006.01)

(52) U.S. Cl.
CPC ......... *H05K 7/1488* (2013.01); *H05K 7/1405* (2013.01)

(58) Field of Classification Search
CPC ........ G06F 1/187; G06F 1/1658; G06F 1/181; G11B 33/123
See application file for complete search history.

(56) References Cited

U.S. PATENT DOCUMENTS

| | | | |
|---|---|---|---|
| 5,506,750 A | 4/1996 | Carteau et al. | |
| 5,682,291 A * | 10/1997 | Jeffries | G06F 1/184 312/223.2 |
| 5,943,208 A * | 8/1999 | Kato | G06F 1/184 248/222.11 |
| 6,487,081 B2 * | 11/2002 | Homer | G11B 33/08 312/223.2 |
| 6,798,650 B2 * | 9/2004 | Reznikov | G11B 33/122 312/223.1 |
| 6,876,547 B2 * | 4/2005 | McAlister | G06F 1/187 250/216 |
| 7,492,586 B2 * | 2/2009 | Peng | G11B 33/124 248/694 |
| 7,609,511 B2 * | 10/2009 | Peng | G11B 33/128 248/633 |
| 7,684,181 B2 * | 3/2010 | Peng | G11B 33/123 312/333 |
| 7,684,182 B2 * | 3/2010 | Zhang | G11B 33/123 16/258 |
| 7,791,871 B2 * | 9/2010 | Peng | G06F 1/187 206/701 |

(Continued)

OTHER PUBLICATIONS

SFF Committee, "SFF-8301 Specification for 3.5" Form Factor Drive Dimensions," 9 pages (Aug. 30, 2014).

*Primary Examiner* — Robert J Hoffberg
*Assistant Examiner* — Hung Dang
(74) *Attorney, Agent, or Firm* — Klarquist Sparkman, LLP (57) ABSTRACT

A carrierless mass storage device retainer assembly for retaining a carrierless mass storage device in a horizontal orientation comprises a base and first and second end surface receiving portions. The base defines a generally horizontal surface. The first end surface receiving portion is shaped to receive a first end of the drive and is movable between an at rest position and an engaged position. The second end surface receiving portion is shaped to receive a second end surface of the drive and has an at rest position spaced from the first end surface receiving portion. The second end surface receiving portion is movable to accommodate a length of the drive, and, with the first and second ends of the drive received therein, is movable back to the at rest position to retain the drive.

22 Claims, 5 Drawing Sheets

(56) References Cited

U.S. PATENT DOCUMENTS

| | | | | |
|---|---|---|---|---|
| 7,835,148 B2* | 11/2010 | Tu | ............................ | G06F 1/187 |
| | | | | 206/701 |
| 7,864,539 B2* | 1/2011 | Dunham | ................. | G06F 1/187 |
| | | | | 312/223.1 |
| 8,406,003 B2* | 3/2013 | Zhang | ..................... | G06F 1/187 |
| | | | | 361/679.39 |
| 8,472,180 B2* | 6/2013 | Gong | .................... | G11B 33/124 |
| | | | | 248/27.1 |
| 8,644,017 B2* | 2/2014 | Dunham | ................. | G06F 1/183 |
| | | | | 361/679.33 |
| 8,720,043 B2 | 5/2014 | Corddry et al. | | |
| 8,743,549 B2 | 6/2014 | Frink et al. | | |
| 8,749,966 B1* | 6/2014 | Boudreau | ................ | G06F 1/187 |
| | | | | 361/679.33 |
| 9,176,546 B2* | 11/2015 | Chen | ........................ | G06F 1/187 |
| 2005/0128697 A1* | 6/2005 | Su | ............................ | G06F 1/187 |
| | | | | 361/679.39 |
| 2009/0097196 A1 | 4/2009 | Peng et al. | | |
| 2009/0129009 A1* | 5/2009 | Zhang | .................... | G11B 33/12 |
| | | | | 361/679.34 |
| 2011/0173805 A1 | 7/2011 | Richet et al. | | |
| 2011/0310550 A1 | 12/2011 | Xu et al. | | |
| 2013/0141863 A1 | 6/2013 | Ross et al. | | |

\* cited by examiner

MASS STORAGE DEVICE RETAINER ASSEMBLY

BACKGROUND

Organizations such as on-line retailers, Internet service providers, search providers, financial institutions, universities and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks.

Each server rack, in turn, includes many servers and associated computer equipment and computer components. Such components include printed circuit boards, mass storage devices, power supplies and processors, as just a few examples. Some known computer systems include a plurality of such larger, multiple-processor computers that are configured into rack-mounted components, and then are subsequently positioned within a rack system. Some known rack systems include 40 such rack-mounted components.

Some servers include a number of mass storage devices in the form of hard disk drives (for example, eight or more hard disk drives) to provide adequate data storage. Typically, the hard disk drives for servers are of a standard, off-the-shelf type. Standard, off-the-shelf hard disk drives are often a cost effective solution for storage needs because such hard disk drives can be obtained at relatively low cost. Nonetheless, in server designs using such standard hard disk drives, the arrangement of the hard disk drives may leave a substantial amount of wasted space in the server chassis. This wasted space, especially when multiplied over many servers in a rack, may result in inadequate computing or storage capacity for a system.

Conventional solutions for retaining hard disk drives in a supporting chassis or other structure, particularly where the hard disk drives (or other form of mass storage devices) are spaced together very closely, are limited. This is especially true for applications in which the hard disk drives are provided without carriers. Such hard disk drives, also referred to as "carrierless" hard disk drives, can be even more closely spaced because their dimensions are smaller. In one typical application, such carrierless hard disk drives do not exceed the standard form factor dimensions, e.g., the 3.5" Form Factor Drive Dimensions as specified in SFF-8301 (incorporated herein by reference), but the same challenges exists for mass storage devices of any size.

DETAILED DESCRIPTION

Figure 1:
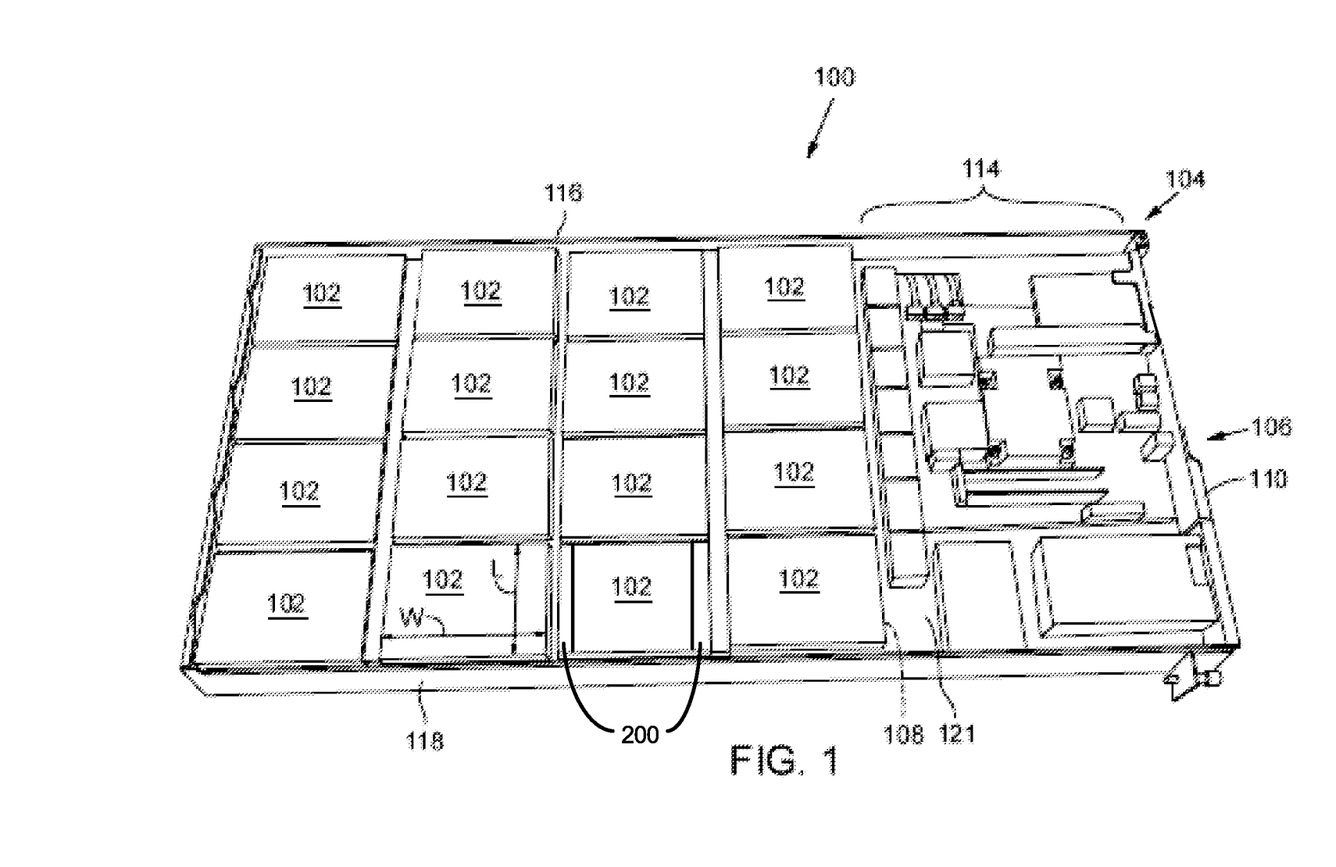
FIG. 1 is a perspective view of one implementation of a data storage module having a plurality of closely spaced mass storage devices, including carrierless hard disk drives, arranged in a horizontal orientation.

FIG. 1 illustrates a perspective view of a data storage module 100 according to some implementations that shows multiple mass storage devices, such as mass storage devices 102, arranged in their horizontal orientation and closely spaced relative to each other. Mass storage devices in the form of carrierless hard disk drives, also referred to as bare hard drives, are advantageous because they occupy less space, are less expensive and are much quicker to install and/or remove than conventional hard disk drives having an external carrier, frame or other structure. Multiplied over many modules, many racks and many installations, the savings provided by such mass storage devices are considerable.

The data storage module 100 includes a chassis 104 for supporting the mass storage devices 102. Optionally, the chassis 104 can be further configured as a drawer 106 in some embodiments, e.g., a 1U drawer in a conventional electronic equipment rack. In the illustrated implementation, there are sixteen mass storage devices 102 arranged in four rows, each having four drives. As illustrated schematically for one of the mass storage devices 102, each of them is connected to a source of electrical power, such as by a wired connection 108 or other equivalent connection, as is described below in greater detail.

The chassis 104 can take many forms, but in the illustrated implementation, the chassis 104 can be described as having a front side 110, a right side 116, a left side 118, a back 120 and a bottom 121. In addition to the mass storage devices 102, the data storage module 100 includes other components, such as are shown in a components space 114 of the chassis 104. FIG. 1 shows a representative retainer assembly 200, as described below in greater detail, holding one of the mass storage devices 102 in its horizontal orientation.

Figure 3:
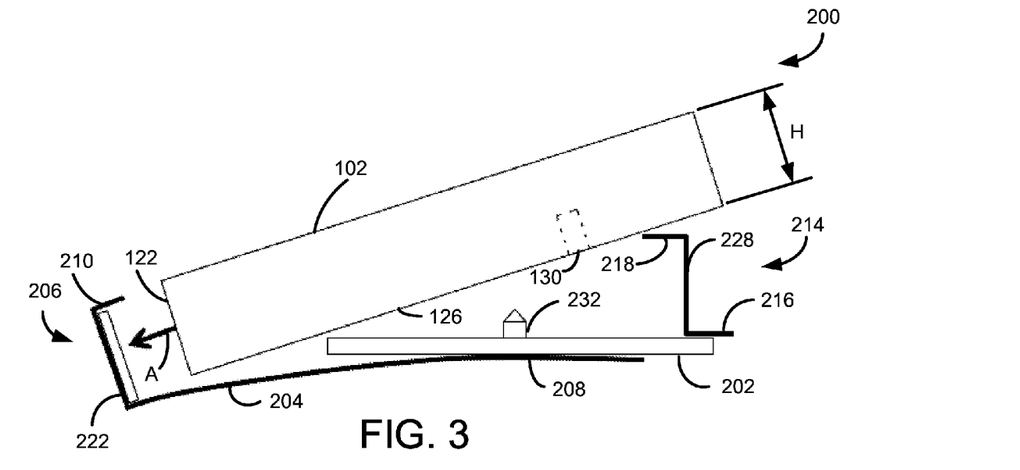
FIG. 3 is a schematic side elevation view of the retainer assembly of FIG. 2A as a mass storage device is being inserted into the retainer.

The mass storage devices 102 can be of any size and shape, but is typically approximately a rectangular prism having dimensions that can be described as a length L (see also FIG. 4), a width W and a height H (FIG. 3). Typically, the mass storage device 102 is a commonly available hard disk drive provided without a carrier and conforming to a recognized specification that includes specified dimensions. For example, some specifications state that qualifying hard disk drive form factors must have dimensions not exceeding set maximum length, width and height dimensions. One example of such a standard is the 3.5" Form Factor Drive Dimensions as specified in SFF-8301. It should be noted that some conventional mass storage devices 102 may depart from one or more of the maximum dimensions over relatively small areas, and thus depart from the geometry of an ideal rectangular prism, but the retainer assemblies described herein are configured to be compatible with such mass storage devices 102.

The mass storage devices 102 in their horizontal orientation as shown can be described as being supported on one of their pair of opposing wider surfaces (i.e., a bottom surface), having opposing end surfaces oriented generally vertically (and separated by the length L) and having opposing narrower surfaces (i.e., side surfaces) also oriented generally vertically (and separated by the width W). Although the data storage module 100 in the illustrated example is described as having sixteen hard disk drives 102, there may be a fewer or a greater number of drives, and the module may extend across multiple vertically and/or horizontally adjacent chassis or similar structures, as well as across multiple data storage modules that are linked together.

Figure 2A:
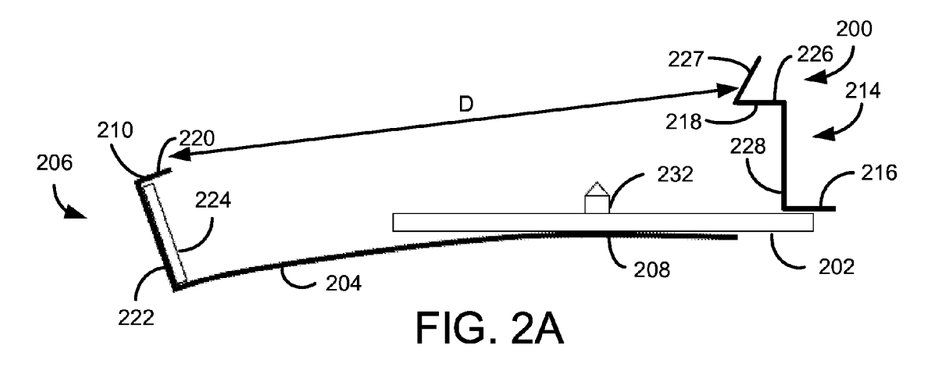
FIG. 2A is a schematic side elevation view of a representative retainer assembly to retain one of the mass storage devices of FIG. 1.

FIG. 2A is a side view in elevation of the representative retainer assembly 200. FIGS. 3-7 are additional side elevation views of the retainer assembly 200 showing a mass storage device 102 at various stages of being received and installed or retained in the retainer assembly 200.

Figure 2B:
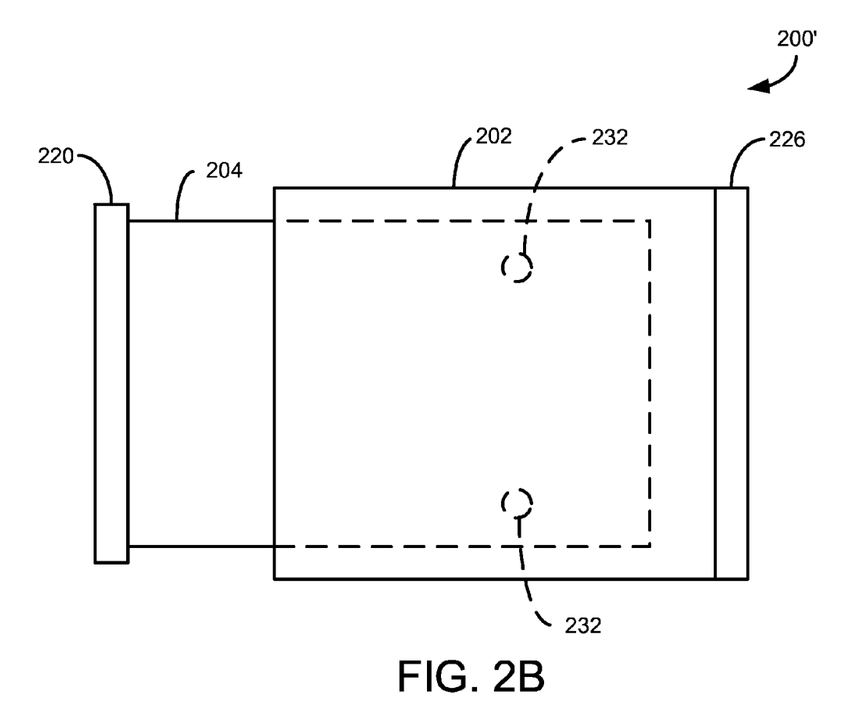
FIG. 2B is a schematic top plan of a retainer assembly closely related to the retainer assembly of FIG. 2A.

Referring to FIG. 2A, the retainer assembly 200 is shown in its normal or at rest position, and without any mass storage device 102. The retainer assembly 200 has a base 202, which is oriented generally horizontally, and a first end surface receiving portion 206. The first end surface receiving portion 206 is configured to receive and retain a first end surface 122 (FIG. 3) of the mass storage device 102, as is described in more detail below. FIG. 2B is a schematic top plan view of a retainer assembly 200' that is closely related to the retainer assembly 200 of FIG. 2A.

The first end surface receiving portion 206 comprises a first member 204 having a fixed end 208 and a distal free end 210. The fixed end 208 can be fixed at any suitable position, such as to the base 202 or to another stationary location. In the illustrated implementation, the fixed end 208 is coupled to an underside of the base 202.

In its at rest position as shown in FIG. 2A, the first end receiving portion 206 is angled away from, or rotated relative to, the base 202. In some implementations, the first end receiving portion 206, through choice of its material(s) and/or configuration, is designed to be biased to the at rest position. Therefore, a force must be applied to move the first end receiving portion 206 from the at rest position to its engaged position (see, e.g., FIG. 7). In addition, the first end receiving portion 206 can be calibrated to exert a force when it is in the engaged position on the mass storage device 102, if desired.

In addition to the first member 204, the first end receiving portion 206 can have a tab 220 (FIG. 2A) that defines its free end 210, and an intermediate section 222 extending between the first member and the tab 220. In the illustrated implementation, the intermediate section 222 extends approximately perpendicular to the first member 204, and the tab 220 extends approximately perpendicular to the intermediate section 222, but configurations with other angles and/or geometries are also possible. Optionally, an inner side of the intermediate section 222 can be fitted with resilient material 224 (FIG. 4) or other damper to lessen any force on the mass storage device 102 when it contacts the intermediate section 222 upon installation and/or while the mass storage device is in the installed position in the retainer assembly 200. Such resilient material can also serve to fill space if there are slight variations in dimensions.

Figure 4:
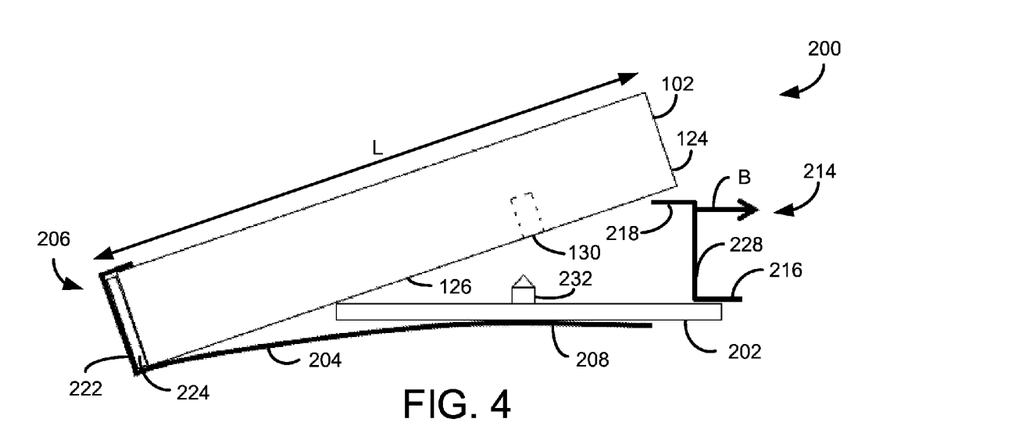
FIG. 4 is a schematic side elevation view of the mass storage device being received in a first end capture receiving portion of the retainer assembly.
Figure 5:
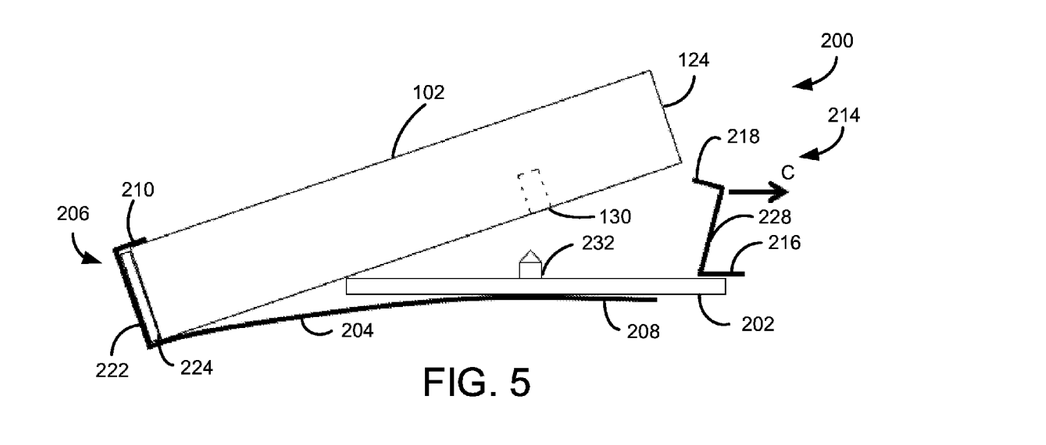
FIG. 5 is a schematic side elevation view of a second end capture receiving portion of the retainer assembly being repositioned to receive the mass storage device.
Figure 6:
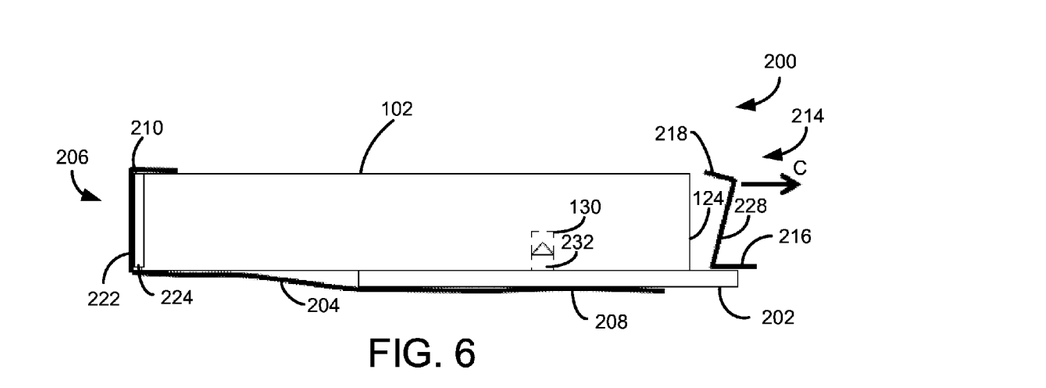
FIG. 6 is a schematic side elevation view showing the retainer assembly with the mass storage device in contact with a base and a locating element received in an aperture on a bottom surface of the mass storage device.

The retainer assembly 200 also includes a second end surface receiving portion 214 configured to receive a second end surface 124 of the mass storage device 102. The second end surface receiving portion 214 has a fixed end 216 and a distal free end 218. The second end surface receiving portion 214 has a normal or at rest position as shown in FIGS. 2A, 3 and 4, but is movable in a direction B, i.e., away from the first end surface receiving portion 206. The fixed end 216 can be coupled to the base 202 or other stationary location.

As shown in FIG. 2A, a distance D separates the free end 210 of the first end surface receiving portion 206 from the free end 218 of the second end surface receiving portion 214. In some embodiments, the distance D is dimensioned to be shorter than the received dimension of the mass storage device 102, e.g., the distance D (FIG. 2A) is less than the length L of the mass storage device 102 (FIG. 4). In this way, the retainer assembly 200 is designed to reduce the force and/or shock to which the mass storage device 102 is subjected if it is inadvertently dropped during the installation.

The free end 218 of the second end surface receiving portion 214 can be defined as a tab 226 (FIG. 2A). The free end 218 can be adapted to allow it be manually manipulated by a user. The second end surface receiving portion 214 can have an intermediate section 228 extending between the fixed end 216 and the tab 220. In the illustrated implementation, the intermediate section 228 extends approximately perpendicular to the base 202, and the tab 226 extends approximately perpendicular to the intermediate section 228, but configurations with other angles and/or geometries are also possible. The tab 226 can be provided with textured material to improve the user's ability to manipulate it. All or a portion of the tab 226 can be shaped with an optional angled cross-section 227 (see, e.g., FIG. 1) to improve the user's ability to manipulate it, as well as to have the mass storage device 102 move the tab 226 by contact with the angled portion (such as would occur during the step shown in FIG. 4).

The second end surface receiving portion 214, through choice of its material(s) and or its configuration, can be biased to the at rest position (FIGS. 2A, 3, 4, and 7), or it may be configured to be movable between the two positions. All or part of the base, the first and second end surface receiving portions and the locating member (discussed below) can be made of metal or other suitable materials.

Optionally, the retainer assembly 200 also includes at least one locating member 206 configured to be received in an aperture 130 or other recess in a bottom surface 126 of the mass storage device 102. Desirably, the aperture 130 is a stock feature of the mass storage device 102, such as is prescribed by a standard, e.g., an aperture typically used for receiving a threaded fastener. In the illustrated implementation, the locating member 206 is positioned to protrude from the base 202. In some implementations, there are multiple locating members and multiple apertures. For example, FIG. 2B shows an implementation in which the retainer assembly 200' has two locating members 232.

Figure 7:
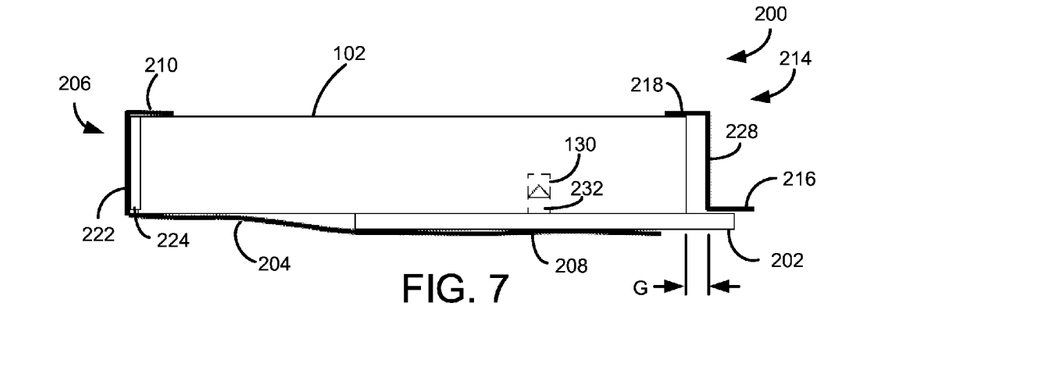
FIG. 7 is a schematic side elevation view showing the retainer assembly after the second end capture portion has been repositioned and the mass storage device is secured in place in the retainer.

In operation, the mass storage device 102 is positioned in the retainer assembly 200 by (1) guiding its first end 122 in the direction A toward the first end receiving portion 206 while its bottom surface 126 can slide along the free end 218 of the second end surface receiving portion (FIG. 3); (2) fully seating the first end surface 122 against the first end surface receiving portion 206, such as in contact with the resilient material 224, with the second end surface 124 being preventing from falling against the base 202 by the free end 218 of the second end surface receiving portion 214 (i.e., because D<L); (3) moving the second end surface receiving portion 214 in the direction B (i.e., away from the first end receiving portion 206, such as by applying a force C) such that the second end surface 124 can pass the free end 218 as the mass storage device 102 is rotated clockwise from the angled position (FIG. 5) to the horizontal position (FIG. 6) with the locating member 232 received in the aperture 130; and (4) allowing the second end surface receiving portion to return to its at rest position (or moving it there) with the free end 218 contacting at least an supper surface of the hard drive 102 to retain it in position (FIG. 7). As shown, the second end surface receiving portion can be positioned such that there is a gap G between the second end surface 124 and the intermediate member 228 when the mass storage device 102 is in installed position as shown in FIG. 7.

Figure 8:
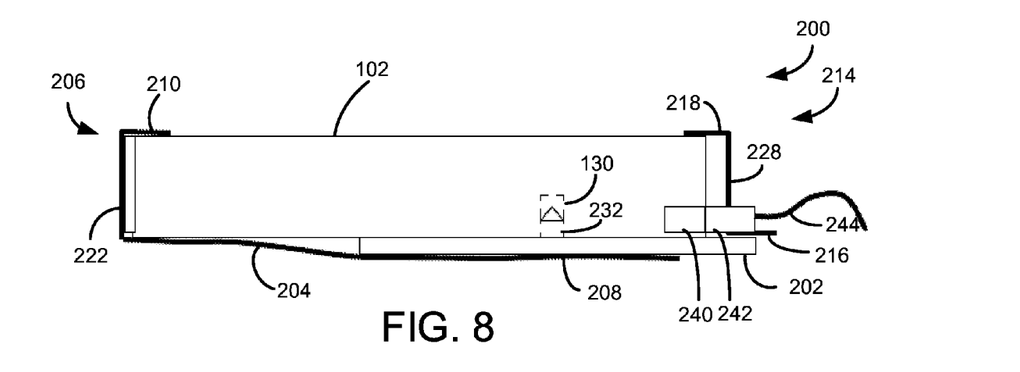
FIG. 8 is a schematic side elevation view showing the mass storage device secured in the retaining assembly and with a connection for the mass storage device extending from the area of the first end capture portion.
Figure 9:
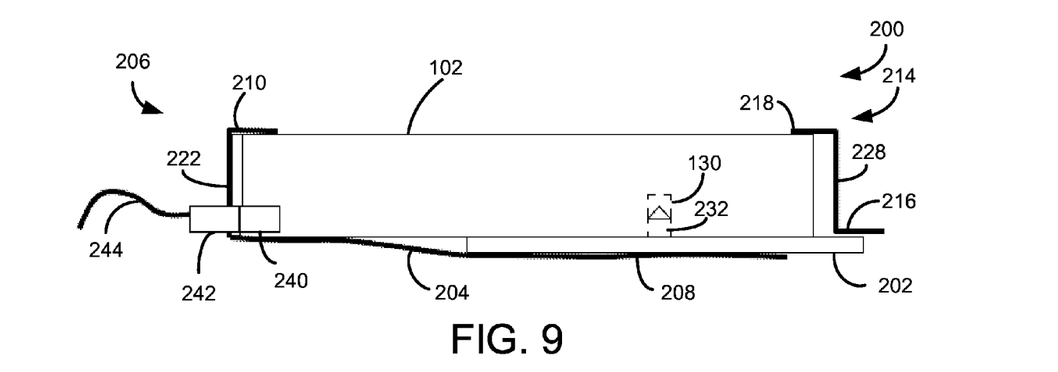
FIG. 9 is a schematic side elevation view showing the mass storage device secured in the retaining assembly and with a connection for the mass storage device extending from the area of the second end capture portion.

As shown in FIGS. 8 and 9, the first end surface receiving portion 206 or the second end surface receiving portion 214 can be configured to accommodate a plug connector 242 and cable 244 extending from a plug recess 240 in either end surface of the mass storage device 102. In other implementations, a different connection to a source of power for the mass storage device 102, such as a direct connection to a circuit board or a backplane, can be provided. For example, a backplane could be provided generally along the intermediate section 222 or along the first member 204.

The base 202 can extend less than the length L or the distance D, and can be formed or one surface or multiple separated surfaces. In the lateral dimension, the base can extend less than the width W of one mass storage device 102, or the base may extend laterally to form the base for two or more adjacent mass storage devices 102. The first end surface receiving portion 206 and the second end surface receiving portion 214 can have respective lateral dimensions that are greater than, equal to or, more desirably, less than the width W of the mass storage device 102.

Referring to FIG. 2B, the various components, including first part 204, the tab 220, the base 202 and the tab 226 can be configured to have the same or different widths (or lateral dimensions).

The second end surface receiving portion 214, through choice of its material(s) and or its configuration, can be biased to the at rest position (FIGS. 2, 3, 4, and 7), or it may be configured to be movable between the two positions. All or part of the base, the first and second end surface receiving portions and the locating member can be made of metal or other suitable materials.

The retainer assembly 200 serves to retain the mass storage device 102 in place and protect it from collisions, side shocks and other undesired forces and movements.

In the illustrated example of FIG. 1, the mass storage devices 102 are approximately 1 inch in height, and the chassis has a height just under 1.75 inches. The 0.75 inch of vertical space can be divided over and under the drives. The spacing between drives, particularly in the direction of their lengths, can be adjusted as needed to allow each to be independently inserted and/or removed from its respective retainer assembly 200.

Although the above implementations have been described for a mass storage device positioned in a generally horizontal orientation, generally understood to mean that the largest surfaces of the mass storage device are positioned generally horizontally, it would also be possible to configure the retainer assembly for use with a mass storage device in a generally vertical orientation. Further, the retainer assembly can be configured for positioning to hold mass storage devices in orientations other than a generally horizontal or a generally vertical orientation, such as an angled orientation.

General Considerations

As used herein, "backplane" means a plate or board to which other electronic components, such as mass storage devices, circuit boards, can be mounted. In some embodiments, mass storage devices, which can include on or more hard disk drives and/or carrierless hard disk drives, are plugged into a backplane in a generally perpendicular orientation relative to the face of the backplane. In some embodiments, a backplane includes and one or more power buses that can transmit power to components on the backplane, and one or more data buses that can transmit data to and from components installed on the backplane.

As used herein, a "cable" includes any cable, conduit, or line that carries one or more conductors and that is flexible over at least a portion of its length. A cable may include a connector portion, such as a plug, at one or more of its ends.

As used herein, "circuit board" means any board or plate that has one or more electrical conductors transmitting power, data, or signals from components on or coupled to the circuit board to other components on the board or to external components. In certain embodiments, a circuit board is an epoxy glass board with one or more conductive layers therein. A circuit board may, however, be made of any suitable combination of materials.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "data center module" means a module that includes, or is suitable for housing and/or physically supporting, one or more computer systems that can provide computing resources for a data center.

As used herein, "member" includes a single element or a combination of two or more elements (for example, a member can include two or more sheet metal parts fastened to one another.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, "mounting" a particular element on another element refers to positioning the particular element to be in physical contact with the other element, such that the other element provides one or more of structural support, positioning, structural load transfer, stabilization, shock absorption, some combination thereof, or the like with regard to the particular element. The mounted particular element may be positioned to rest upon one or more upper surfaces of the other element, independent of coupling the elements via one or more coupling elements. In some embodiments, mounting the particular element to another element includes coupling the elements such that the other element provides one or more of structural support, positioning, structural load transfer, stabilization, shock absorption, some combination thereof, or the like with regard to the particular element.

As used herein, "installing" a particular element on another element refers to physically coupling the elements such that the particular element is communicatively coupled with at least the other element. Installing the elements can include electrically coupling the elements via physically coupling an electrical connector of the particular element with a complementary electrical connector of the other element. Installing a particular element to another element can include electrically coupling a portion of the particular element to a portion of the other element and mounting another portion of the particular element to another portion of the other element.

As used herein, "primarily horizontal," also interchangeably referred to hereinafter as "horizontally-oriented," means at least more horizontal than vertical. In the context of an installed element or device, "primarily horizontal" or "horizontally oriented" includes an element or device whose installed width is greater than its installed height. In some embodiments, a horizontally-oriented element or device is fully horizontal.

As used herein, "primarily vertical," also interchangeably referred to hereinafter as "vertically-oriented," means at least more vertical than horizontal. In the context of an installed element or device, "primarily vertical" or "vertically-oriented" includes an element or device whose installed height is greater than its installed width. In the context of a hard disk drive, "primarily vertical" or "vertically-oriented" includes a hard disk drive that is installed such that the installed height of the hard disk drive is greater than the installed width of the hard disk drive. In some embodiments, a vertically-oriented element or device is fully vertical.

As used herein, a "rack" means a rack, container, frame, or other element or combination of elements that can contain or physically support one or more computer systems.

As used herein, "room" means a room or a space of a building. As used herein, "computer room" means a room of a building in which computer systems, such as rack-mounted servers, are operated.

As used herein, a "space" means a space, area or volume.

As used herein, "shelf" means any element or combination of elements on which an object can be rested. A shelf may include, for example, a plate, a sheet, a tray, a disc, a block, a grid, or a box. A shelf may be rectangular, square, round, or another shape. In some embodiments, a shelf may be one or more rails.

As used herein, "shock absorbing," as applied to a supporting element for another element, means that the supporting element absorbs mechanical energy and/or at least partially mitigates shock and/or vibration loads. A shock-absorbing material may be elastic, viscoelastic, viscous, or combinations thereof.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope of these claims.

What is claimed is:

1. A carrierless mass storage device retainer assembly for retaining a carrierless mass storage device in a horizontal orientation, comprising:
    a base defining a generally horizontal surface when the retainer assembly is installed, the base being configured to contact a bottom of the carrierless mass storage device;
    a first end surface receiving portion shaped to receive a first end of a carrierless mass storage device, the first end surface receiving portion having a fixed end coupled to the base, an elongate flexible member extending away from the fixed end and having a free length extending along the base, and a free end supported at a distal end of the elongate flexible member, wherein the elongate flexible member is pivotable about the fixed end;
    a second end surface receiving portion shaped to receive a second end surface of the carrierless mass storage device, the second end surface receiving portion having an at rest position spaced from the first end surface receiving portion by a separating distance less than a length of the carrierless mass storage device that separates its first and second end surfaces, the second end surface receiving portion having a fixed end coupled to the base and a free end movable from the at rest position away from the first end surface receiving portion to lengthen the separating distance to exceed the length of the carrierless mass storage device to allow the second end surface of the carrierless mass storage device to be received in the second end surface receiving portion;

wherein, when the retainer assembly is in an installed position, the elongate flexible member is pivotable to reposition the free end of the first end surface receiving portion from an at rest position biased at an angled orientation relative to horizontal into approximate alignment with the free end of the second end surface receiving portion.

2. The carrierless mass storage device retainer assembly of claim 1, wherein the first end surface receiving portion comprises an intermediate section extending at an angle from the elongate flexible member and a tab extending at an angle from the intermediate section, wherein a distal end of the tab defines the free end of the first end surface receiving portion.

3. The carrierless mass storage device retainer assembly of claim 2, wherein an inner side of the intermediate section comprises resilient material configured to contact the first end of the carrierless mass storage device when the carrierless mass storage device is received.

4. The carrierless mass storage device retainer assembly of claim 1, wherein the angled orientation of the first end surface receiving portion in the at rest position at one end and the free end of the second end surface receiving portion at an opposite end together define an insertion direction along which the carrierless mass storage device is initially inserted into the retainer assembly.

5. The carrierless mass storage device retainer assembly of claim 1, wherein the base is dimensioned to extend less than the length of the carrierless mass storage device.

6. The carrierless mass storage device retainer assembly of claim 1, wherein the second end surface receiving portion comprises a flexible intermediate section extending at an angle from the fixed end and a tab extending at an angle from the intermediate section, wherein a distal end of the tab defines the free end of the second end surface receiving portion.

7. The carrierless mass storage device retainer assembly of claim 1, wherein the second end surface receiving portion is configured to be manually movable from the at rest position away from the first end surface receiving portion.

8. The carrierless mass storage device retainer assembly of claim 1, wherein the second end surface receiving portion is positioned to define a gap between the second end surface receiving portion and the second end surface of the carrierless mass storage device when the carrierless mass storage device is received in the retainer assembly with the locating member engaged in the aperture of the carrierless mass storage device receiving assembly.

9. The carrierless mass storage device retainer assembly of claim 1, further comprising a locating member protruding from the base and positioned to engage an aperture in the bottom surface of the carrierless mass storage device when the carrierless mass storage device is received in the retainer assembly, wherein the second end surface receiving portion contacts only a top surface of the carrierless mass storage device when the carrierless mass storage device is received in the retainer assembly with the locating member received in the aperture.

10. A carrierless mass storage device retainer assembly for retaining a carrierless mass storage device in a horizontal orientation, comprising:

a base defining a generally horizontal surface when the retainer assembly is installed, the base being configured to contact a bottom of the carrierless mass storage device;

a first end surface receiving portion shaped to receive a first end of a carrierless mass storage device, the first end surface receiving portion having a fixed end coupled to the base and a flexible free end movable between an at rest position biased at an angled orientation relative to the generally horizontal surface and an engaged position;

a second end surface receiving portion shaped to receive a second end surface of the carrierless mass storage device, the second end surface receiving portion having an at rest position spaced from the first end surface receiving portion by a separating distance less than a length of the carrierless mass storage device that separates its first and second end surfaces, the second end surface receiving portion having a fixed end coupled to the base and a free end movable from the at rest position away from the first end surface receiving portion to lengthen the separating distance to exceed the length of the carrierless mass storage device to allow the second end surface of the carrierless mass storage device to be received in the second end surface receiving portion; and a locating member protruding from the base and positioned to engage an aperture in the bottom surface of the carrierless mass storage device when the carrierless mass storage device is received in the retainer assembly, wherein the first end surface receiving portion is configured to permit a plug connection and cable to extend outward from the first end surface of the carrierless mass storage device beyond the first end surface receiving portion.

11. A carrierless mass storage device retainer assembly for retaining a carrierless mass storage device in a horizontal orientation, comprising:

a base defining a generally horizontal surface when the retainer assembly is installed, the base being configured to contact a bottom of the carrierless mass storage device;

a first end surface receiving portion shaped to receive a first end of a carrierless mass storage device, the first end surface receiving portion having a fixed end coupled to the base and a flexible free end movable between an at rest position biased at an angled orientation relative to the generally horizontal surface and an engaged position;

a second end surface receiving portion shaped to receive a second end surface of the carrierless mass storage device, the second end surface receiving portion having an at rest position spaced from the first end surface receiving portion by a separating distance less than a length of the carrierless mass storage device that separates its first and second end surfaces, the second end surface receiving portion having a fixed end coupled to the base and a free end movable from the at rest position away from the first end surface receiving portion to lengthen the separating distance to exceed the length of the carrierless mass storage device to allow the second end surface of the carrierless mass storage device to be received in the second end surface receiving portion; and a locating member protruding from the base and positioned to engage an aperture in the bottom surface of the carrierless mass storage device when the carrierless mass storage device is received in the retainer assembly, wherein the second end surface receiving portion is configured to permit a plug connection and cable to extend outward from the second end surface of the carrierless mass storage device beyond the second end surface receiving portion.

12. The carrierless mass storage device retainer assembly of claim 1, wherein the second end surface receiving portion is shaped to have an angled surface adjacent the free end.

13. A carrierless mass storage device retainer assembly for retaining a carrierless mass storage device, comprising:
a base defining a supporting surface when the retainer assembly is installed, the base being configured to support a bottom of the carrierless mass storage device;
a first end surface receiving portion shaped to receive a first end surface of a carrierless mass storage device, the first end surface receiving portion pivotable about an axis extending transverse to the supporting surface from an at rest position biased at a downwardly angled orientation relative to the supporting surface; and
a second end surface receiving portion shaped to receive a second end surface of the carrierless mass storage device and having an at rest position spaced from the first end surface receiving portion, the second end surface receiving portion being movable from the at rest position away from the first end surface receiving portion to allow a length of the carrierless mass storage device separating the first and second end surfaces to be received in the retainer assembly, wherein with first end surface receiving portion pivoted upwardly into alignment with the second end surface receiving portion, the second end surface receiving portion is movable back to the at rest position with the first and second end surfaces of the carrierless mass storage device received in the respective first and second end surface receiving portions to retain the carrierless mass storage device.

14. The carrierless mass storage device retainer assembly of claim 13, wherein the first and second end surface receiving portions are configured to have biased positions.

15. The carrierless mass storage device retainer assembly of claim 13, wherein the first end surface receiving portion is formed of metal and configured to be biased to the at rest position.

16. The carrierless mass storage device retainer assembly of claim 13, wherein the first end surface receiving portion is dimensioned to extend laterally less than a width of the carrierless mass storage device.

17. The carrierless mass storage device retainer assembly of claim 13, wherein the second end surface receiving portion is formed of metal and configured to be biased to the at rest position.

18. The carrierless mass storage device retainer assembly of claim 13, wherein the second end surface receiving portion is dimensioned to extend laterally less than a width of the carrierless mass storage device.

19. The carrierless mass storage device retainer assembly of claim 13, wherein when the first end surface receiving portion is pivoted from the at rest position to the engaged position with a carrierless mass storage device received therein, the first end surface receiving portion causes the carrierless mass storage device to rotate relative to the supporting surface.

20. The carrierless mass storage device retainer assembly of claim 13, wherein the first end surface receiving portion comprises a backplane to which a carrierless mass storage device received in the retainer assembly can be connected.

21. The carrierless mass storage device retainer assembly of claim 13, wherein the base further defines a supporting surface for a neighboring retainer assembly.

22. A data storage module having a plurality of carrierless mass storage devices arranged in a horizontal orientation, comprising:
a chassis having a plurality of carrierless mass storage device spaces, each of the spaces being dimensioned to receive a carrierless mass storage device positioned in a horizontal orientation, the carrierless mass storage device in the horizontal orientation having opposing first and second generally vertical end surfaces defining a length of the device and separated by alternating pairs of opposing generally horizontal wide surfaces defining a width of the device and generally vertical narrow surfaces defining a height of the device; and
at least one retainer assembly positioned in a selected one of the carrierless mass storage device spaces having a first end surface receiving portion pivotable about a pivot axis extending beneath the selected carrierless mass storage device space to position a distal end to engage the first end surface of the device, a second end surface receiving portion movable to engage the second end surface of the device and a vertically extending locating member positionable in a lower one of the opposing generally horizontal wide surfaces of the device when the device is in a retained position in the selected one of the carrierless mass storage device spaces.

* * * * *